United States Patent [19]

Nishizawa

[11] Patent Number: 4,917,757

[45] Date of Patent: Apr. 17, 1990

[54] METHOD OF PERFORMING SOLUTION GROWTH OF ZNSE CRYSTALS

[75] Inventor: Jun-ichi Nishizawa, Sendai, Japan

[73] Assignee: Zaidan Hojin Handotai Kenkyu Shinkokai, Sendai, Japan

[21] Appl. No.: 153,567

[22] Filed: Feb. 3, 1988

Related U.S. Application Data

[63] Continuation of Ser. No. 783,805, Oct. 4, 1985, abandoned, which is a continuation of Ser. No. 509,053, Jun. 29, 1983, abandoned.

[30] Foreign Application Priority Data

Jul. 2, 1982 [JP] Japan ............................. 57-115893

[51] Int. Cl.$^4$ ...................... C30B 29/46; C30B 29/48; C30B 7/10; C30B 35/00

[52] U.S. Cl. .................................. 156/624; 156/605; 156/DIG. 72; 148/33; 422/245; 437/159; 437/965

[58] Field of Search ............... 156/610, 611, 621, 624, 156/616 R, 605, DIG. 72; 164/122.1, 122.2, 345; 422/247, 248, 253, 245; 148/187–189, 33; 437/159, 965

[56] References Cited

U.S. PATENT DOCUMENTS

| 4,315,796 | 2/1982 | Nishizawa | 156/622 X |
| 4,389,256 | 6/1983 | Nishizawa et al. | 148/189 X |
| 4,526,632 | 7/1985 | Nishizawa et al. | 148/188 X |

FOREIGN PATENT DOCUMENTS

| 3798 | 1/1982 | Japan . |
| 57-77098 | 5/1982 | Japan . |
| 57-183400 | 11/1982 | Japan . |

OTHER PUBLICATIONS

Honig et al., Vapor Pressure Data for the Solid and Liquid Elements, RCA Review, Jun. 1969, pp. 285–305.
Harsy; Synthesis and Growth of ZnS, ZnSe, ZnTe, GaS, Ga$_2$Se$_3$ and InS Crystals in Ga and In Melts, Material Research Bulletin, vol. 3, 1968, pp. 483–487.
Rubenstein, Solution Growth of Some II–VI Compounds Using Tin as a Solvent, J. of Crystal Growth, vol. 34, 1968, pp. 309–312.
Rubenstein; Solubilities of Some II–VI Compounds in Bismuth, J. of Electro-Chemical Society, vol. 113, 1966, p. 623.

Primary Examiner—Gary P. Straub
Attorney, Agent, or Firm—Cushman, Darby & Cushman

[57] ABSTRACT

In a method of performing a solution growth of a ZnSe crystal using Se as a solvent and relying on the temperature difference technique, the growth is performed under the conditions that the vapor pressure of Zn which is lower than the vapor pressure of Se is applied, under controlled manner, to the solvent during the growth process, in which the value of the Zn vapor pressure is held constant at 7.2 atm. ±30%, whereby a ZnSe crystal having a good crystal perfection is obtained.

4 Claims, 4 Drawing Sheets

METHOD OF PERFORMING SOLUTION GROWTH OF ZNSE CRYSTALS

This is a continuation of application No. 06/783,805 filed Oct. 4, 1985, now abandoned, which was a continuation of application No. 06/509,053 filed June 29, 1983, abandoned.

BACKGROUND OF THE INVENTION (a) Field of the invention

The present invention pertains to a method of growing Group II-VI compound semiconductor crystals, and more particularly it relates to a method of performing solution growth of ZnSe crystals.

(b) Description of the prior art

Group II-VI compound semiconductor crystals such as ZnS, ZnSe and CdS in general have energy band gaps greater than those of Group IV semiconductor crystals and of Group III-V compound semiconductor crystals, and also they are such crystals that the transition of carriers is of the direct transition type, and therefore the Group II-VI compound semiconductor crystals are given much expectation as a material for constituting semiconductor devices having interesting characteristics which are not obtained by other semiconductor crystals. Especially, a ZnSe crystal has an energy band gap of 2.67 eV at room temperature, and accordingly expectation is placed on the development, in the future, of LEDs (light-emitting diodes) having emission spectra in the wavelength region (450–490 nm) of blue color.

This ZnSe crystal, like other conventional Group II-VI compound semiconductor crystals, has been difficult to attain its crystal growth, and also controlling of its conductivity type and impurity concentration has not been easy.

That is, a ZnSe compound semiconductor crystal (hereinafter to be abbreviated as ZnSe crystal) is obtained by relying on such growth method as is featured by a melt growth at a high temperature which is typically represented by Bridgman method. In such case, Se vacancies are noted to have been generated in a large number in the ZnSe crystal thus grown, owing to the high vapor pressure of Se atoms. Because these Se vacancies act as the donor of the carriers, the ZnSe crystal which is produced by relying on said prior growth method has usually been of the n type having a high resistivity. Moreover, there has not been established the technique to control the value of this resistivity, and the present status in the art is such that, in addition to the abovesaid inconveniences, no p type crystal can be obtained in practical state.

Accordingly, while the useful properties of the ZnSe crystal have been appreciated, the technology has not developed so far to provide a device in which a practical pn junction is formed.

Even if a technique for the formation of a pn junction is established based on the conventional crystal growth, i.e. the melt growth method, and an LED consisting of a diode having a pn junction is formed, it should be noted that the vacancies of Se which is a Group VI element become combined with the atoms of the impurity present to serve as the non-radiative centers or form deep energy levels, so that the light-emission efficiency of such an LED will become very low, or there cannot be obtained no good LED but just an LED wherein the radiation through deep levels is dominant. From the foregoing facts, it has been desired to obtain a semiconductor crystal having a high crystal perfection which will never form such deep levels as referred to above, and also to establish a technique for forming a pn junction based on such crystal. Solution growth methods using various kinds of solutions have been attempted so far, but none of them has attained a ZnSe crystal having a high crystal perfection.

The present inventor, standing on the viewpoint that what is most important in the growth process relying on the method of performing a solution growth of such Group II-VI compound semiconductor crystal such as ZnSe crystal to attain the above-mentioned purpose and desire, is to control the deviation of the crystal from stoichiometric composition to a minimum value, earlier has invented a solution growth method which utilizes the temperature difference method using, as a solvent, a melt of that element having a higher vapor pressure among the crystal-constituting elements, and which disposes a source crystal in the higher temperature region of the solvent, performing recrystallization of the crystal in the lower temperature region, and also using the vapor pressure controlling method which applies, from outside of said solvent, the vapor pressure of the element having the lower vapor pressure, and applied for patent in Japan under Patent Preliminary Publication No. Sho No. 57-183400 entitled "A method and an apparatus for growing a Group II-VI compound semiconductor crystal". Here, the said earlier invention will be briefed concretely with respect to a ZnSe crystal which is relevant to the present invention. As discussed above, the conventional melt growth method performs the growth at a high temperature. Besides, in such method, Se atoms have a higher vapor pressure over Zn atoms, causing a shortage of Se atoms, and thus there could have obtained only those crystals exhibiting a great deviation from stoichiometric composition. As such, in said earlier invention, Se is used as a solvent to compensate for the shortage of Se within the crystal to be grown to thereby minimize the deviation of the crystal composition from stoichiometry, and also the vapor pressure of Zn is controlled externally so as to be optimum, to thereby make it possible to obtain a semiconductor crystal having a high crystal perfection and a high impurity concentration of the p type.

While said earlier invented method has markedly enhanced the technique of controlling the crystallinity, conductivity type and carrier concentration, there has not yet been established optimum manufacturing conditions for obtaining good crystals, because of the fact that the earlier invention provides for a new technique.

SUMMARY OF THE INVENTION

It is, therefore, the object of the present invention to provide the manufacturing conditions which permit the growth of ZnSe crystal having a good crystal perfection with good repetitivity in the above-mentioned method.

More particularly, it is another object of the present invention to provide the range of vapor pressures of Zn as the manufacturing condition to minimize the amount of presence of those centers of deep levels within the crystal to be grown.

DETAILED DESCRIPTION OF THE PREFERRED EMBODIMENTS

Figure 1:
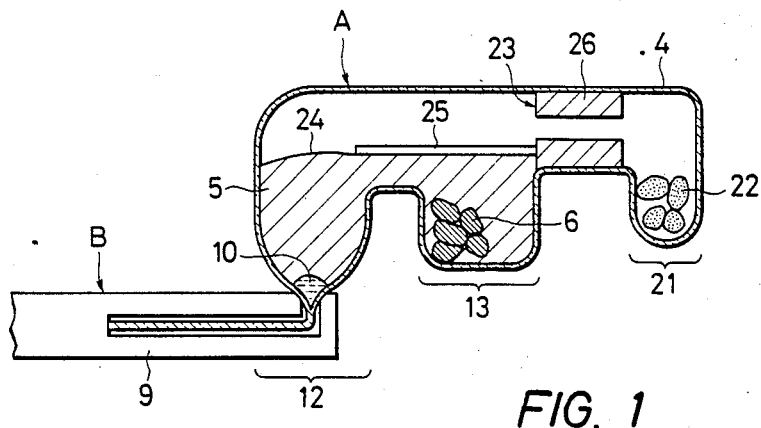
FIG. 1 is a longitudinal sectional view showing the structure of a quartz ampule of horizontal type employed in the solution growth of a ZnSe crystal according to the present invention.

As stated above, the present invention is one which was discovered during the experiments performed based on the solution growth method disclosed in Japanese Patent Preliminary Publication No. Sho No. 57-183400, and accordingly, the present invention cannot be stated independently thereof. Thus, the following description is made in connection with said patent application.

According to what is disclosed in said patent application, the melt which serves as a solvent and which is employed in performing a solution growth of a ZnSe crystal is composed mainly of Se atoms. In case Se is used as a solvent, consideration has to be placed on the following points. That is, although the growth temperature can be set at a level lower than that of a melt growth, consideration requires to be put to the fact that Se has a high vapor pressure, and also there has to be established an appropriate temperature difference between the region in which a grown crystal is obtained and the region in which a source crystal is placed.

With respect to the former, i.e. with respect to the high vapor pressure of Se, there is usually employed a quartz 4 tube for the growth of a ZnSe crystal 10, and the use of the so-called closed system, e.g. an ampule A, is suitable for this purpose. The inner pressure within the ampule will elevate to a considerably high level during the growth process.

In case, for example, a quartz ampule having an inner diameter of about 10 mm is used, it should be noted that, if the thickness of the tube of this quartz ampule is about 2 mm, this tube can sufficiently resist the inner pressure up to about 8–10 atmospheric pressure. Beyond 10 atmospheric pressure, however, there arises a high risk of explosion of the ampule, because of little mechanical strength at such sites of the ampule as the region where a stress is applied or where the thickness is small. In order to avoid such hazards, it is necessary to place this ampule in another pressure-resistant tube made of quartz to thereby apply a pressure exteriorly of the contained ampule by such gas as air, Ar or $N_2$, to lower the effective pressure which is applied to the ampule.

The thermal conductivity of gas will rise as the pressure of the gas increases. Accordingly, in case a pressure is applied exteriorly of the ampule as stated above, the controlling of the temperature difference between the region 12 wherein the crystal 6 is recrystallized and the region 13 wherein the source crystal 6 is placed becomes important.

In such case, there is an optimum value in the temperature difference which constitutes a growth condition for obtaining a good crystal perfection. This optimum value of temperature difference is associated mutually with such various conditions as the growth temperature, temperature difference, and the pressure applied around the ampule. In general, an appropriate temperature difference between the source crystal region 13 and the growth region 12 is about 10°–50° C.

With respect to the correlation between the amount of the solvent 5 contained in the ampule and the amount of the source crystal 6, there is no severe limitation, but a desirable range is about 2~20 g of source crystal relative to about 10 g of solvent. It is also important in what manner the source crystal is set to face the solvent for the region wherein the crystal is grown. Various designs may be considered. Basically, however, it is desirable to effect the setting by taking into consideration the relationship of the specific gravities of the solvent and of the crystal to be grown. In case the solvent has a large specific gravity, such setting can be effected relatively by floating easily the source crystal on the surface of the solvent. In case this relationship of specific gravities is the reverse, it will be noted that the source crystal will sink into the solvent before the source crystal dissolves in the solvent. In such case, the aimed object can be attained by, for example, using a horizontal type system as shown in FIG. 1 for providing a horizontal positional relationship between the source region and the growth region. In case, however, among the elements constituting a ZnSe crystal, there is used an element having a high vapor pressure as a solvent, it is possible to effect the supply of the element having a high vapor pressure to the crystal being grown. This, however, will result, conversely, in the growth of a crystal having a shortage of the low vapor pressure or having an excessive amount of element having a high vapor pressure. Thus, it is not possible to obtain a crystal of no defects and of controlled stoichiometric composition in a strict sense. In order to eliminate the abovesaid drawback, it is necessary that the element having a low vapor pressure be supplied in good balance. If, however, an element having a low vapor pressure is merely introduced to an element having a high vapor pressure, there will advance a reaction between these two kinds of elements, and a crystal is formed in the solvent. Accordingly, the amount of the low vapor pressure element which is supplied to the crystal being grown will become different between the start of crystal growth and the termination of the growth. As a result, the stoichiometric composition of the crystal thus grown undergoes a change during the growth process, and it is not possible to obtain a crystal having a good uniformity of composition. It is, therefore, desirable to supply to the crystal being grown the low vapor pressure element at substantially a constant rate. In addition, it is necessary to arrange so that, in order to minimize direct reaction of these two types of elements within the solvent, the vapor pressure of the low vapor pressure element is applied, at a substantially constant value, from above the solvent throughout the crystal growth process.

The above said Japanese Patent Preliminary Publication No. Sho 57-183400 was proposed centering around the technique briefed above.

An example of the structure of the ZnSe crystal growth apparatus (growth ampule) of the present invention following the contents of said Japanese application and an example of the temperature distribution obtained thereby are shown in FIGS. 1, 2, 3 and 4. Among them, FIGS. 1 and 2 pertain to a horizontal type growth system, whereas FIGS. 3 and 4 concern a vertical type growth system. Description will hereunder be made of these structures.

The ampule structure A comprises, in addition to a crystal deposition region 12 and a source crystal region 13, another region 21 in which Zn 22 is placed. By controlling the temperature of the region 21, the vapor pressure of Zn is controlled. In case the connecting tube 23 for coupling the crystal growth region and the Zn region is of a large diameter, there would arise a reaction between the vapor of Se which is a high vapor pressure element and the vapor of Zn, and owing to this vapor reaction, there would be formed a ZnSe within the Zn region 21. As a result, the controlling of the vapor pressure of Zn becomes difficult. Thus, in case of the horizontal type growth system as shown in FIG. 1, it is effective to provide a roof member 25 to minimize the area of the exposed surface 24 as will be understood from the Figure. Thus, it is desirable to provide such an arrangement that Zn vapor is applied to the solvent only from above the crystal deposition region. In addition thereto, it is effective to narrow the passage connecting this crystal growth region and the Zn region for the purpose of thermal isolation. To this end, there has been adopted the arrangement that a quartz tube 26 having an outer diameter substantially same as the inner diameter of the ampule at the outlet portion of the region 21 within the ampule after the growth materials have been charged. Also, at the forward end of the crystal growth region of the quartz ampule, there is provided a heat sink B at 9, substantially in contact therewith, to facilitate the escape of heat therethrough in order to insure that the growth of the crystal 10 takes place at the forward tip portion of the growth region.

Figure 2:
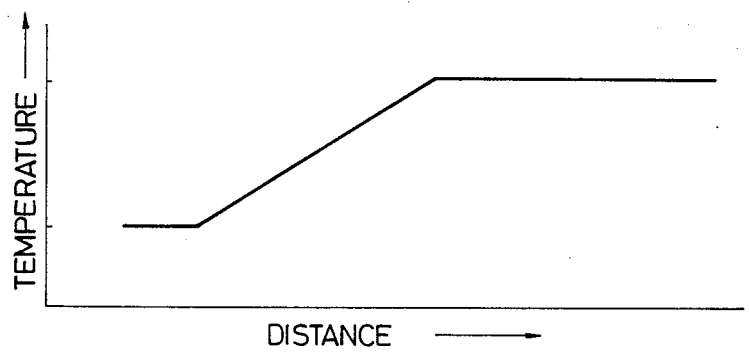
FIG. 2 is a chart showing the temperature distribution for imparting a temperature difference in said ampule of FIG. 1.
Figure 3:
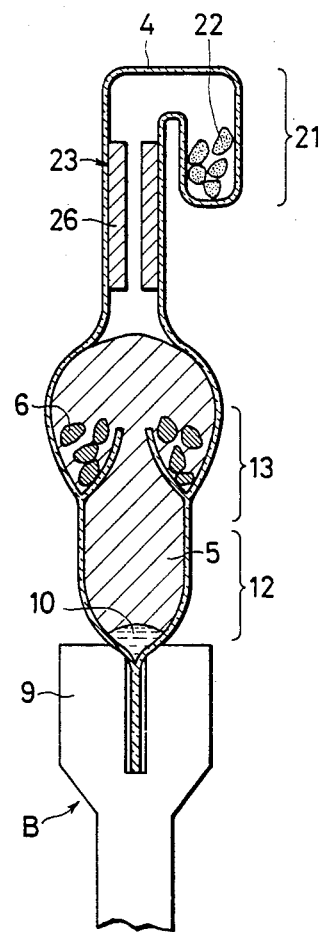
FIG. 3 is a longitudinal sectional view showing the structure of a quartz ampule of vertical type employed in the solution growth of a ZnSe crystal according to the present invention.
Figure 4:
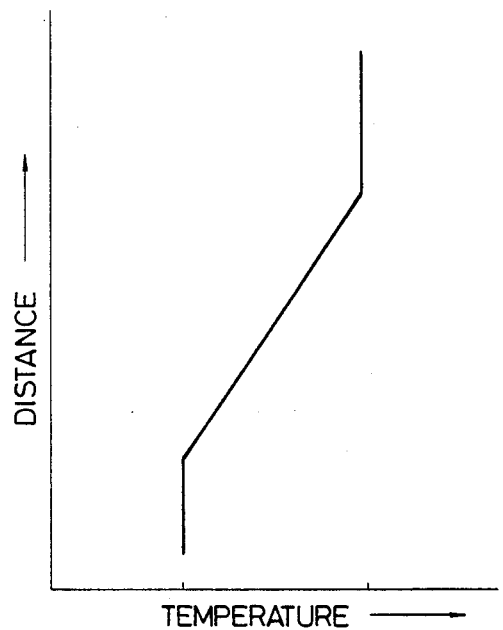
FIG. 4 is a chart showing the temperature distribution for imparting a temperature difference in said ampule of FIG. 3.

In FIGS. 2 and 4, the constant temperature zone is expressed in the form of two temperature zones for easy understanding. It is necessary, however, to arrange so that the crystal growth region 12, the source crystal region 13 and the vapor pressure controlling region 21 are controlled of their temperatures independently of each other to hold constant temperatures, respectively.

Generally speaking, it is desirable to arrange so that the temperature difference between the region 12 and the region 13 may be set arbitrarily within the range of about 5°–50° C. Both the value of the temperature difference and the value of the temperature gradient are factors which intensively affect the characteristics of the grown crystal, and therefore, it is necessary to select optimum values for these factors, while taking other conditions also into consideration.

It is also desirable to provide a heating means (not shown) separately for the vapor pressure controlling region 21 so as to enable the temperature of this region independently.

Based on the foregoing things, experiments were conducted to minimize the deviation of the ZnSe crystal from stoichiometric composition by varying various growth conditions. As a result, it has been found that the vapor pressure of Zn gives the most intensive influence upon said deviation from stoichiometry, i.e. upon the amount of the deep level centers, and accordingly it strongly serves to control the emission spectra when the crystal is fabricated into an LED.

It is, therefore, the object of the present invention to provide optimum conditions for Zn vapor pressure which minimizes the deviation from stoichiometric composition which constitutes the factor most powerfully controlling the crystal perfection of the ZnSe crystal which is grown.

The present invention will hereunder be described in further detail by referring to the preferred embodiments.

Although the deviation from stoichiometry is caused partly by the effect of other factors such as temperature difference as stated above, the most influential factor has been found to be the vapor pressure of Zn which is applied to the solvent. Therefore, crystals were grown, with other conditions being the same and only varying the vapor pressure of Zn. As the means for determining the deviation from stoichiometry, the experiments relied on the amount of emission spectra through the centers having deep levels due to Se vacancies.

The variation of Zn vapor pressure can be obtained from the equation:

$$\log_{10} P_{Zn} = -\frac{6113}{T} + 2.628 \log_{10} T$$

representing the relationship between the vapor pressure $P_{Zn}$ (Torr) of Zn and the temperature T(°K.) sought from the data of Honig et al (RCA Review, 1969, June, pp 285–305). The relationship between the temperature and the vapor pressure is tabulated in Table 1 by using the above-mentioned equation.

TABLE 1

| T (°C.) | $P_{Zn}$ (Torr) | $P_{Zn}$ (atm) |
|---|---|---|
| 1000 | 2278 | 3.00 |
| 1020 | 2815 | 3.70 |
| 1040 | 3460 | 4.55 |
| 1060 | 4229 | 5.56 |
| 1080 | 5140 | 6.76 |
| 1100 | 6216 | 8.18 |
| 1120 | 7480 | 9.84 |

In accordance with this table, the temperature of the Zn vapor pressure controlling region was set.

A quartz ampule A having a length of 8 cm and a height of 3 cm and a volume of 10 cm³ and having such construction as shown in FIG. 1 wherein the growth region 12 and the source region 13 are arranged so as to communicate with each other was used. 20 g of Se 5 was charged in the growth region 12, 5 g of source crystal 6 was changed in the source region 13 and 4 g of Zn 22 was charged in the vapor pressure controlling region 21. After performing a sufficient baking treatment in vacuum, the forward end of the ampule 4 was pinched off in a vacuum of $1 \times 10^{-6}$ mmHg, to provide a closed ampule. Thereafter, the temperature of the source region 13 was kept constant at 1060° C., and the recrystallizing region 12 was set at a constant temperature of 1050° C. The temperature of the vapor pressure controlling region 21 containing Zn 22 was selected to be constant to permit the vapor pressure of Zn to be set as desired within the range of 5–10 atm. for each growth of crystal. The growth process lasted for about 120 hours at a constant temperature. As a result, there was obtained a single crystal having a length of 10 mm and a diameter of 8 mm and having an outstandingly good crystal habit as compared with conventionally obtained crystals. In view of the good crystal habit, by doping into the solvent an acceptor impurity such as Li which is a Group Ia element, there could be obtained a crystal exhibiting a p type conductivity type stably for any value of Zn vapor pressure. This means that by adopting the method proposed in said Japanese Patent Preliminary Publication No. Sho 57-183400, there can be established a technique for obtaining a semiconductor crystal having a good crystal perfection, and of which the conductivity type as well as the carrier concentration have been controlled. Also, the above thing signifies at the same time that a technique has been established to form a diode having a pn junction by either epitaxially forming an n type layer using this crystal or through a diffusion process or through an alloying process using an impurity exhibiting an n type conductivity. In this embodiment, however, the diffusion method was adopted which permits the formation of an n type layer at a low temperature and during a relatively short period of time, from the viewpoint of not varying the characteristics of the crystal in order to manufacture a diode.

Concretely, an ampule A containing ZnSe crystal immersed in the Zn solution within the ampule 4 was enclosed in vacuum, and it was subjected to a thermal treatment at 1000° C. for about 30 minutes to form an n type layer of about several micrometers. The surface on the p type side of this crystal was subjected to lapping, polishing and etching treatments, to form an electrode for ohmic contact with the p type and the n type layers, and thus a light-emitting diode was manufactured.

Figure 5:
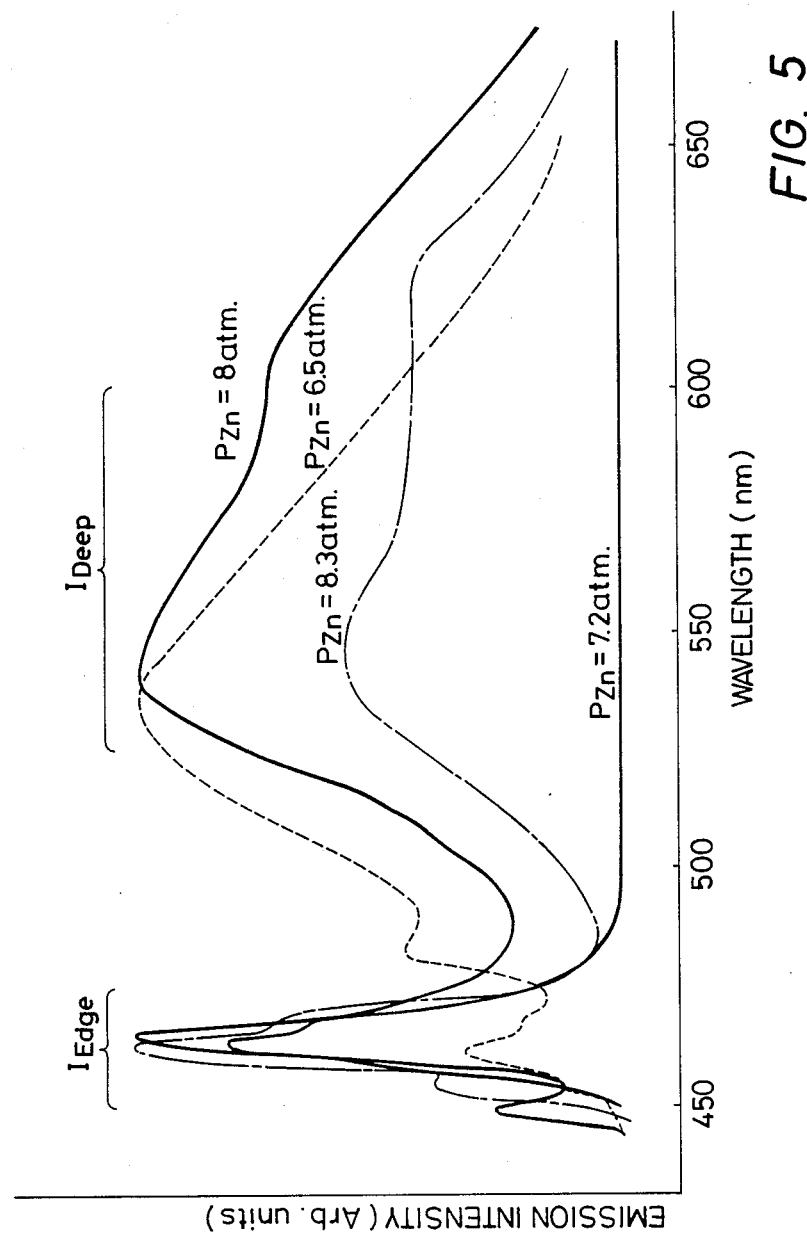
FIG. 5 is a chart showing the result of experiment of the emission spectra of a ZnSe LED obtained by varying the Zn vapor pressure in the growth.

By varying the vapor pressure of Zn, a p type ZnSe crystal was manufactured, and the example of emission spectra of an LED manufactured by using this crystal is shown in FIG. 5.

Figure 6:
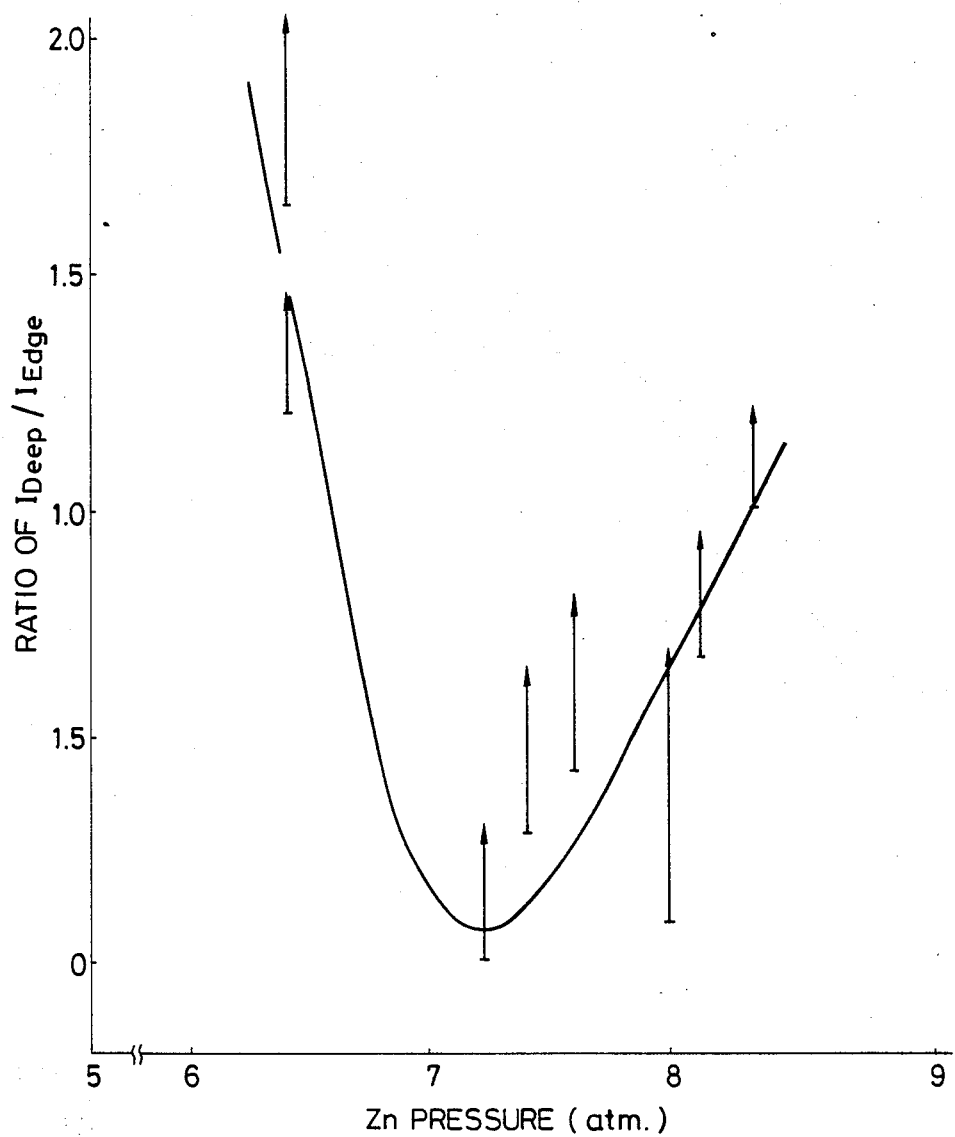
FIG. 6 is a chart depicting the result of experiment showing the relationship of the ratio $I_{DEEP}/I_{EDGE}$ observed in the emission spectra of a ZnSe LED relative to the Zn vapor pressures.

In ordinary cases, there are observed an emission spectra having a peak intensity $I_{Edge}$ in the range of 450-500 nm substantially corresponding to the energy band gap of ZnSe and also a broad emission spectra having a peak intensity $I_{Deep}$ in the vicinity of 550 nm associated with the deep level corresponding to the deviation from stoichiometry, as shown in FIG. 5. As will be noted therefrom, the intensity of these two kinds of emission spectra strongly depends upon the vapor pressure of Zn which is applied. When the Zn vapor pressure $P_{Zn}$ was 7.2 atm., it was found that the emission spectra associated with the deep level almost completely disappeared. The relationship between this Zn vapor pressure and the ratio $I_{Deep}/I_{Edge}$ which have been obtained experimentally is plotted in FIG. 6. As will be noted from the chart of FIG. 6, the value of the ratio $I_{Deep}/I_{Edge}$ exhibits a minimum value when $P_{Zn} = 7.0 \sim 7.4$ atm. For other values of $P_{Zn}$, the value of the ratio $I_{Deep}/I_{Edge}$ assumes large values, irrespective of whether the value of $P_{Zn}$ is great or small. That is, it has been found that when the Zn vapor pressure is set at a value in the range $7.0 \sim 7.4$ atm., the density of deep levels which are formed by the Se vacancies corresponding to the deviation from stoichiometry becomes minimum. Accordingly, by setting the vapor pressure of Zn at a value in the vicinity of 7.2 atm., there can be obtained a ZnSe crystal having an extremely good crystal perfection. The range of the optimum Zn vapor pressure may cover a wide range of values. The range which is considered appropriate in general from the viewpoint of natural phenomena most desirably may be said to be the range which becomes 1/e of the $Z_n$ pressure, i.e. a value of Zn vapor pressure $P_{Zn}$ which is about ±30% relative to the value 7.2 atm. at which $I_{Deep}$ becomes extinct.

Also, when the ZnSe crystal obtained by the application of a Zn vapor pressure at the above-mentioned value is examined on, for example, an X-ray diffraction apparatus, no inclusion of Se is found, and as such the above-described growth conditions may be termed to be the conditions for obtaining a semiconductor crystal of a very high crystal perfection having very few defects.

What is claimed is:

1. A method of fabricating a p-type ZnSe crystal minimizing deviation from stoichiometry relying on a temperature difference between a crystal source region and a crystal growth region using Se as the sole solvent material, using a IA group element as a p-type impurity, applying a constant Zn vapor pressure having a value which is larger than 6.5 atm. and smaller than 8 atm. to the surface of the Se solvent in the crystal growth region during the crystal growth period, and keeping said crystal growth region at a constant temperature of 1050° C.

2. A method according to claim 1, wherein said method is performed by keeping the temperature difference between the crystal growth region and the crystal source region at a level ranging from 5° C. to 50° C.

3. A method of fabricating a ZnSe pn junction device by heat treatment of one surface of a p-type ZnSe crystal in a Zn solution to form an n-type region, the p-type ZnSe crystal minimizing deviation from stoichiometry relying on a temperature difference between a crystal source region and a crystal growth region using Se as the sole solvent material, using a IA group element as a p-type impurity, applying a constant Zn vapor pressure having a value which is larger than 6.5 atm. and smaller than 8 atm. to the surface of the Se solvent in the crystal growth region during the crystal growth period, and keeping said crystal growth region at a constant temperature of 1050° C.

4. A method of fabricating a ZnSe pn junction device according to claim 3, wherein the n type region of the crystal is formed by said heat treatment which is performed at 1000° C. for thirty minutes

* * * * *